US012707877B2

(12) United States Patent
Kim et al.

(10) Patent No.: US 12,707,877 B2
(45) Date of Patent: Aug. 11, 2026

(54) DISPLAY APPARATUS AND METHOD FOR MANUFACTURING DISPLAY APPARATUS

(71) Applicant: Samsung Display Co., LTD., Yongin-si (KR)

(72) Inventors: Hyun Seok Kim, Hwaseong-si (KR); Hee Kyun Shin, Incheon (KR); Jun Ho Sim, Hwaseong-si (KR); Tae Wook Kang, Seongnam-si (KR); Woo Jin Cho, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 1083 days.

(21) Appl. No.: 17/787,548

(22) PCT Filed: Feb. 14, 2020

(86) PCT No.: PCT/KR2020/002141
§ 371 (c)(1),
(2) Date: Jun. 20, 2022

(87) PCT Pub. No.: WO2021/125438
PCT Pub. Date: Jun. 24, 2021

(65) Prior Publication Data

US 2022/0384748 A1 Dec. 1, 2022

(30) Foreign Application Priority Data

Dec. 20, 2019 (KR) ........................ 10-2019-0171883

(51) Int. Cl.
*H10K 71/80* (2023.01)
*H10K 59/80* (2023.01)
(Continued)

(52) U.S. Cl.
CPC ........... *H10K 71/80* (2023.02); *H10K 77/111* (2023.02); *H10K 59/873* (2023.02); *H10K 2102/311* (2023.02); *H10K 2102/351* (2023.02)

(58) Field of Classification Search
CPC ............ H10K 77/111; H10K 2102/311; H10K 71/80; G09F 9/301
See application file for complete search history.

(56) References Cited

U.S. PATENT DOCUMENTS 9,111,812 B2 8/2015 Yoo et al.
9,166,191 B2 10/2015 Yoon
(Continued)

FOREIGN PATENT DOCUMENTS

CN 102769109 A 11/2012
CN 104616596 A 5/2015
(Continued)

OTHER PUBLICATIONS

English Translation of Seok KR 101968814B1. Translation on Sep. 10, 2025.*

(Continued)

*Primary Examiner* — Amar Movva
(74) *Attorney, Agent, or Firm* — CANTOR COLBURN LLP

(57) ABSTRACT

A method for manufacturing a display apparatus according to an embodiment includes: preparing a carrier substrate and forming a sacrificial layer on a top surface of the carrier substrate, where the sacrificial layer includes a cover area and an exposure area located on at least one side of the cover area; forming a first flexible material having a bottom surface in contact with the sacrificial layer on a top surface of the cover area of the sacrificial layer to expose the exposure area of the sacrificial layer; and removing the exposure area of the sacrificial layer.

14 Claims, 20 Drawing Sheets

(51) Int. Cl.
*H10K 77/10* (2023.01)
*H10K 102/00* (2023.01)

(56) References Cited

U.S. PATENT DOCUMENTS

| | | | |
|---|---|---|---|
| 9,312,512 B2 | 4/2016 | Kang et al. | |
| 10,229,933 B2 | 3/2019 | Seo et al. | |
| 10,319,944 B2 | 6/2019 | Lee et al. | |
| 10,777,775 B2 | 9/2020 | Chien et al. | |
| 10,847,753 B2 | 11/2020 | Lee et al. | |
| 10,886,480 B2 | 1/2021 | Shin et al. | |
| 10,923,682 B2 | 2/2021 | Lee et al. | |
| 11,296,285 B2 | 4/2022 | Xu et al. | |
| 11,508,918 B2 | 11/2022 | Jiang | |
| 11,647,665 B2 | 5/2023 | Shin et al. | |
| 11,930,661 B2 | 3/2024 | Lee et al. | |
| 12,490,601 B2 | 12/2025 | Lee et al. | |
| 2014/0008657 A1 | 1/2014 | Lu et al. | |
| 2015/0188079 A1 | 7/2015 | Kang et al. | |
| 2015/0195915 A1* | 7/2015 | Namkung | B32B 37/26 156/247 |
| 2017/0186829 A1 | 6/2017 | Yamazaki et al. | |
| 2018/0040858 A1* | 2/2018 | Chien | H10K 71/80 |
| 2019/0187101 A1* | 6/2019 | Gerardo | G01N 29/0654 |
| 2019/0189973 A1 | 6/2019 | Kang et al. | |
| 2019/0237688 A1 | 8/2019 | Shin et al. | |

FOREIGN PATENT DOCUMENTS

| | | |
|---|---|---|
| CN | 105390525 A | 3/2016 |
| CN | 105679806 A | 6/2016 |
| CN | 106449694 A | 2/2017 |
| CN | 107706305 A | 2/2018 |
| CN | 108365128 A | 8/2018 |
| CN | 109830621 A | 5/2019 |
| CN | 110491913 A | 11/2019 |
| KR | 100805589 | 2/2008 |
| KR | 1020120103388 A | 9/2012 |
| KR | 20140067528 A | 6/2014 |
| KR | 1020140147380 | 12/2014 |
| KR | 1020150009289 | 1/2015 |
| KR | 1020150029045 | 3/2015 |
| KR | 1020150052645 | 5/2015 |
| KR | 101530378 | 6/2015 |
| KR | 1020150080862 A | 7/2015 |
| KR | 101580015 | 12/2015 |
| KR | 1020180035988 | 4/2018 |
| KR | 1020180055642 A | 5/2018 |
| KR | 101968814 | 4/2019 |
| KR | 1020190093232 A | 8/2019 |
| KR | 102049248 B1 | 11/2019 |
| KR | 1020200007109 | 1/2020 |
| WO | 2019119127 | 6/2019 |

OTHER PUBLICATIONS

Partial European Search Report—European Application No. 20901463.8 dated Dec. 8, 2023, citing references listed within.

Philippe Poulin, et al., "Superflexibility of graphene oxide", PNAS, Oct. 4, 2016, vol. 113, No. 40, pp. 11088-11093.

International Search Report—PCT/KR2020/002141 dated Sep. 18, 2020.

European Office Action for Application No. 20 901 463.8 dated Nov. 6, 2025 enumerating the above listed 1 references.

* cited by examiner

DISPLAY APPARATUS AND METHOD FOR MANUFACTURING DISPLAY APPARATUS

TECHNICAL FIELD

The present disclosure relates to a display apparatus and a method for manufacturing a display apparatus.

BACKGROUND ART

A display apparatus for displaying an image has been widely used for various electronic appliances for providing an image to a user, such as smart phones, tablet personal computers ("PCs"), digital cameras, notebook computers, navigators, and smart televisions. A display apparatus includes a display apparatus configured to generate and display an image and various input devices.

The display apparatus may refer to any types of electronic devices which provide a display screen. For example, the display apparatus may include a television, a notebook computer, a monitor, a billboard, the Internet-of-things ("IoT"), as well as portable electronic devices that provide a display screen, such as mobile phones, smartphones, tablet personal computers (PCs), electronic watches, watch phones, mobile communication terminals, electronic notebooks, electronic books, portable multimedia players ("PMPs"), navigation systems, game consoles, digital cameras, and the like.

Research has been widely conducted on a flexible display apparatus including a flexible substrate. The flexible display apparatus is deposited on a rigid carrier substrate. After the flexible display apparatus is completely deposited on the carrier substrate, the carrier substrate must be detached from the display apparatus. For example, as the detachment process, a process of removing adhesion by irradiating a laser to a flexible substrate of the flexible display apparatus and removing the carrier substrate through a mechanical detachment method may be used.

However, in the case of the above process, a residual film of the flexible substrate may remain on the surface of the carrier substrate, making it difficult to reuse the carrier substrate.

DISCLOSURE

Technical Problem

Aspects of the present disclosure provide a method for manufacturing a display apparatus in which a carrier substrate can be reused after a flexible display apparatus is deposited on the carrier substrate.

Aspects of the present disclosure also provide a display apparatus manufactured by the above method for manufacturing a display apparatus.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

Technical Solution

According to an aspect of the present disclosure, there is provided a method for manufacturing a display apparatus including: preparing a carrier substrate and forming a sacrificial layer on a top surface of the carrier substrate, the sacrificial layer including a cover area and an exposure area located on at least one side of the cover area; forming a first flexible material having a bottom surface in contact with the sacrificial layer on a top surface of the cover area of the sacrificial layer to expose the exposure area of the sacrificial layer; and removing the exposure area of the sacrificial layer.

The preparing of the carrier substrate may further include negatively charging the top surface of the carrier substrate.

The negatively charging of the top surface of the carrier substrate may be performed using an atmospheric-pressure plasma device.

The forming of the sacrificial layer may include alternately forming a first coating layer charged with a first electric charge and a second coating layer charged with a second electric charge having a different polarity from a polarity of the first electric charge.

The first electric charge may be a positive charge and the second electric charge may be a negative charge.

The first coating layer and the second coating layer may each include graphene oxide ("GO").

The removing of the exposure area of the sacrificial layer may be performed using the atmospheric-pressure plasma device or through washing with water.

After removing the exposure area of the sacrificial layer, side surfaces of the sacrificial layer and the flexible material may be aligned.

The method may further include forming a first barrier layer on the first flexible material after removing the exposure area of the sacrificial layer.

The method may further include sequentially forming a second flexible material on the first barrier layer, a circuit driving layer on the second flexible material, a light emitting layer on the circuit driving layer, and an encapsulation layer on the light emitting layer.

The method may include removing the carrier substrate from the first flexible material after removing the exposure area of the sacrificial layer.

In the removing of the carrier substrate from the first flexible material, the sacrificial layer may remain on the top surface of the carrier substrate and on a bottom surface of the first flexible material.

A thickness of the sacrificial layer remaining on the top surface of the carrier substrate may be smaller than a thickness of the sacrificial layer remaining on the bottom surface of the first flexible material.

The method may further include removing the sacrificial layer remaining on the top surface of the carrier substrate after removing the carrier substrate from the first flexible material.

The removing of the sacrificial layer remaining on the top surface of the carrier substrate may be performed using the atmospheric-pressure plasma device or through washing with water.

According to another aspect of the present disclosure, there is provided a method for manufacturing a display apparatus including: preparing a carrier substrate and forming a sacrificial layer on a top surface of the carrier substrate; forming a first flexible material having a bottom surface in contact with the sacrificial layer on a top surface of the sacrificial layer; removing the carrier substrate from the first flexible material, where the sacrificial layer remains on the top surface of the carrier substrate; and removing the sacrificial layer remaining on the top surface of the carrier substrate to reuse the carrier substrate.

The removing of the sacrificial layer remaining on the top surface of the carrier substrate may be performed using an atmospheric-pressure plasma device or through washing with water.

In the removing of the carrier substrate from the first flexible material, the sacrificial layer may further remain on the bottom surface of the first flexible material.

A thickness of the sacrificial layer remaining on the top surface of the carrier substrate may be smaller than a thickness of the sacrificial layer remaining on the bottom surface of the first flexible material.

According to still another aspect of the present disclosure, there is provided a display apparatus including: a first flexible substrate; a first barrier layer disposed on a top surface of the first flexible substrate; a second flexible substrate disposed on the first barrier layer; a circuit driving layer disposed on the second flexible substrate; and a residue disposed on a bottom surface that is opposite to the top surface of the first flexible substrate, wherein one side surface of the residue is aligned with one side surface of the first flexible substrate.

Advantageous Effects

According to a display apparatus and a method for manufacturing the display apparatus in accordance with one embodiment, a carrier substrate may be reused after a flexible display apparatus is deposited on the carrier substrate.

However, the effects of the embodiments are not restricted to the one set forth herein. The above and other effects of the embodiments will become more apparent to one of daily skill in the art to which the embodiments pertain by referencing the claims.

MODE FOR INVENTION

Advantages and features of the present invention and methods of accomplishing the same may be understood more readily by reference to the following detailed description of exemplary embodiments and the accompanying drawings. The present invention may, however, be embodied in many different forms and should not be construed as being limited to the exemplary embodiments set forth herein; rather, these exemplary embodiments are provided so that this invention will be thorough and complete and will fully convey the concept of the invention to those skilled in the art, and the present invention will only be defined by the appended claims.

When an element or layer is disposed "on" another element or layer, it may be directly disposed on another element or layer, or another layer or another element may be interposed therebetween.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Hereinafter, embodiments of the present disclosure will be described with reference to the attached drawings.

Figure 1:
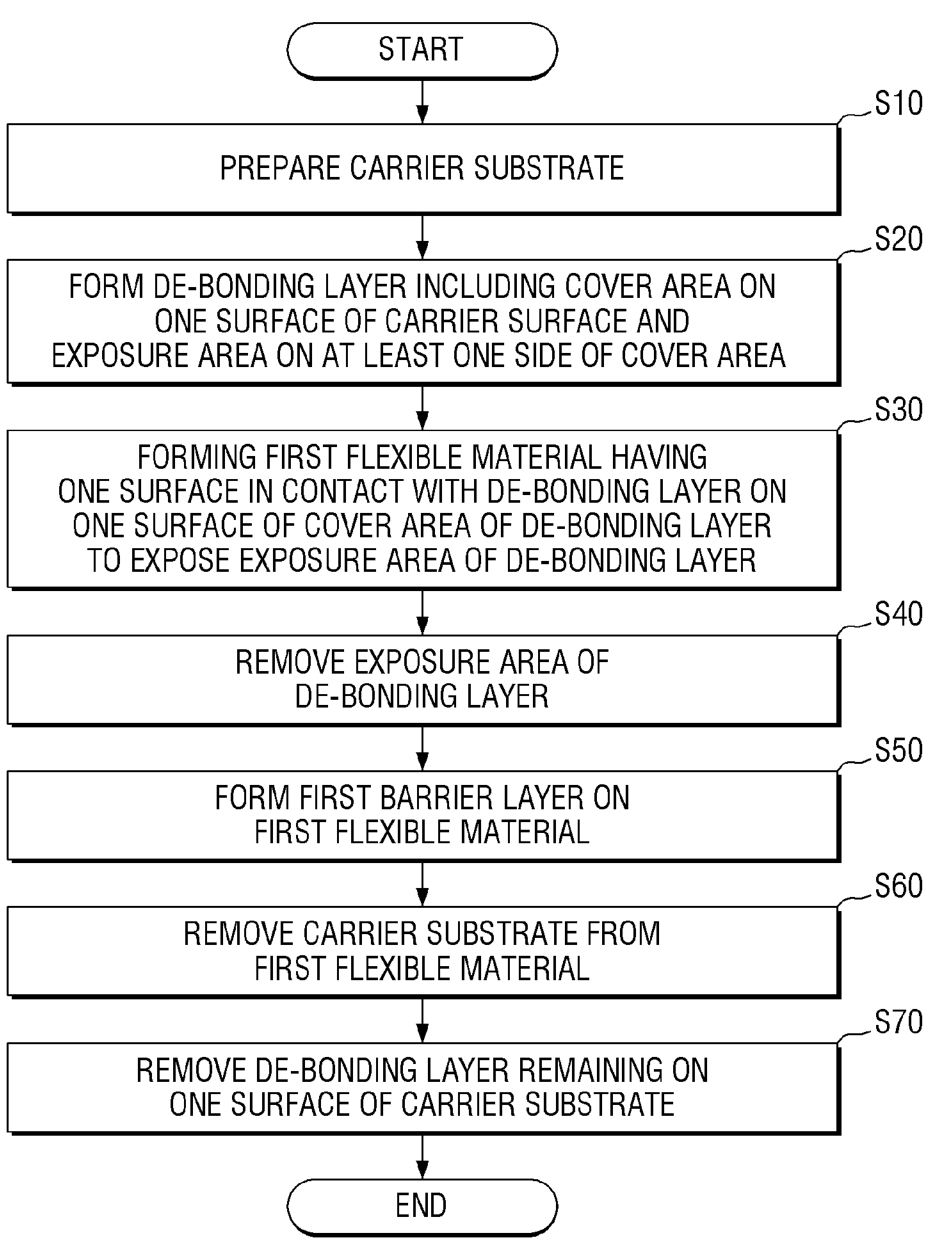
FIG. 1 is a flowchart illustrating a method for manufacturing a display apparatus according to an embodiment.
Figure 2:
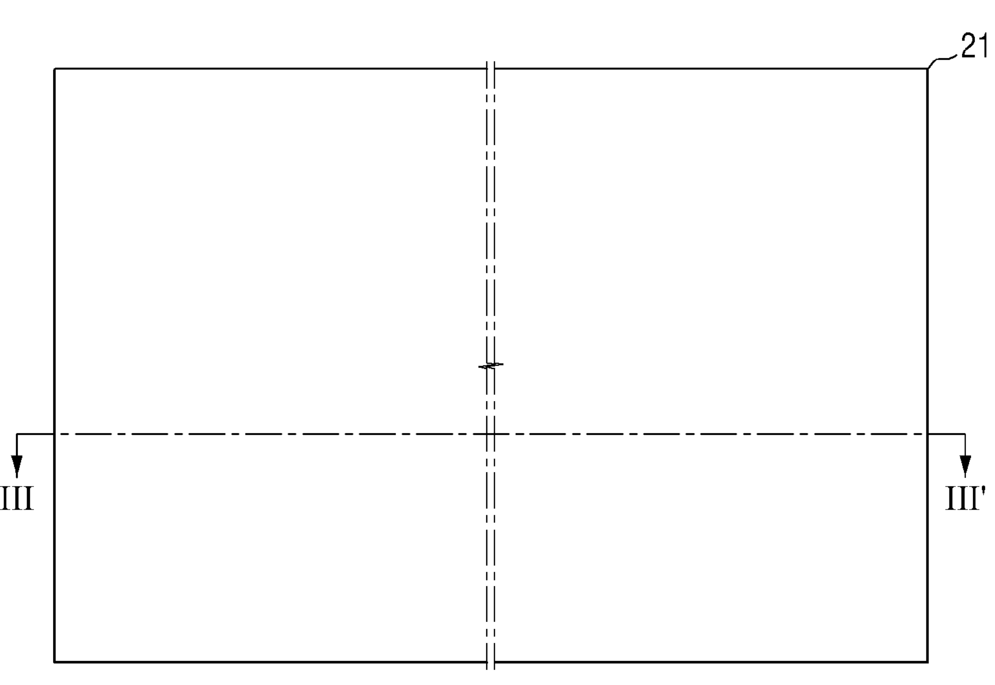
FIG. 2 is a plan view illustrating a carrier substrate according to an embodiment.
Figure 2:
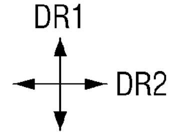
Figure 3:
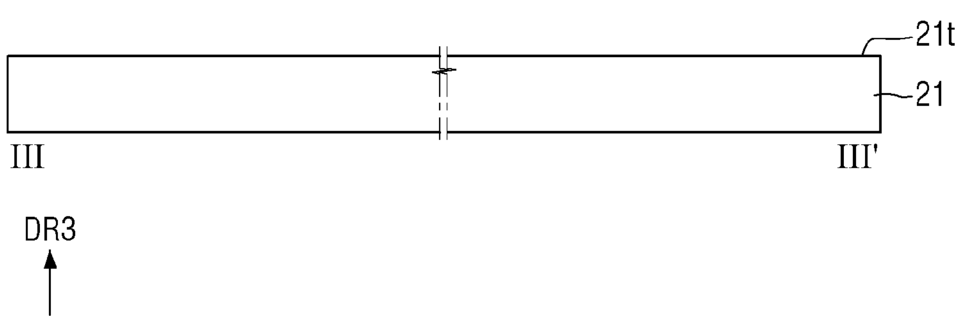
FIG. 3 is a cross-sectional view taken along line III-III' of FIG. 2.
Figure 18:
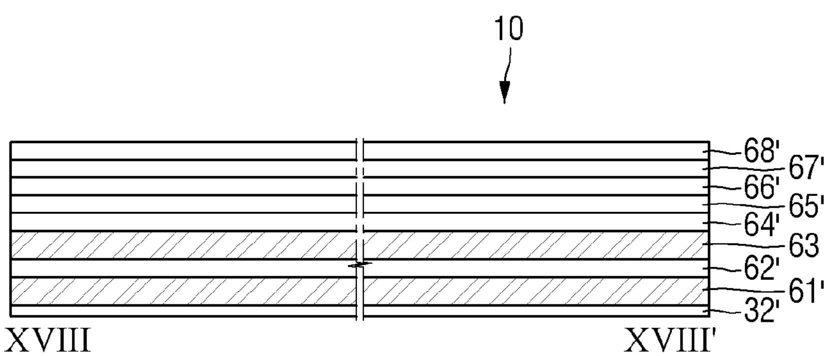
Figure 19:
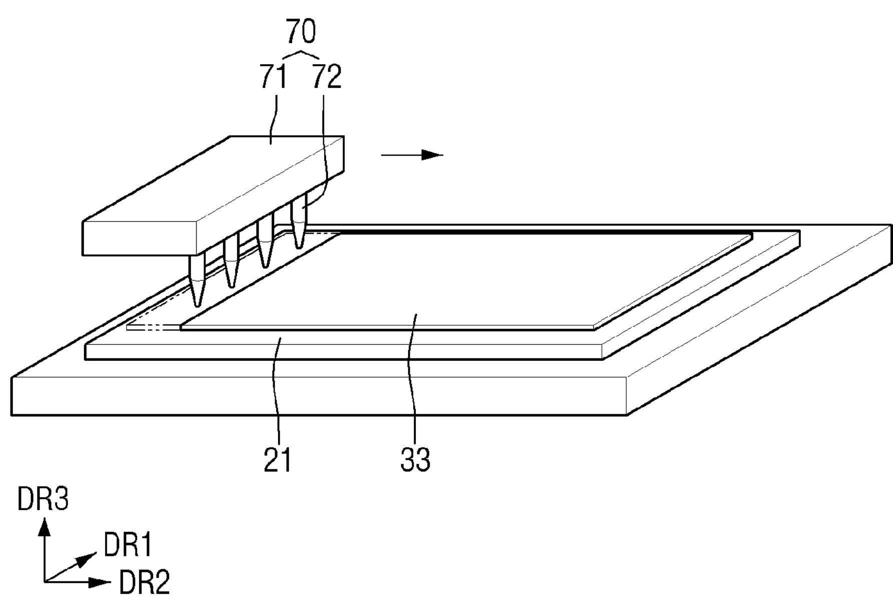
FIG. 19 is a perspective view illustrating a process of a method for manufacturing a display apparatus according to an embodiment.

FIG. 1 is a flowchart illustrating a method for manufacturing a display apparatus according to an embodiment, FIG. 2 is a plan view illustrating a carrier substrate according to an embodiment, FIG. 3 is a cross-sectional taken along line III-III' of FIG. 2, FIGS. 4 to 10, FIGS. 12 to 16, and FIG. 18 are sequential cross-sectional views illustrating a method for manufacturing a display apparatus, and FIG. 19 is a perspective view illustrating a process of a method for manufacturing a display apparatus according to an embodiment.

In embodiments, a first direction DR1 and a second direction DR2 are different directions intersecting each other. In the plan view of FIG. 2, for convenience of description, the first direction DR1 that is a vertical direction and the second direction DR2 that is a horizontal direction are defined. Further, a third direction DR3 is a thickness direction perpendicular to a plane defined by the first direction DR1 and the second direction DR2. The "plan view" is a view in the thickness direction DR3. In the following embodiments, one side in the first direction DR1 represents an upward direction in a plan view, and the other side in the first direction DR1 represents a downward direction in a plan view. One side in the second direction DR2 represents a direction toward the right side in a plan view, and the other side in the second direction DR2 represents a direction toward the left side in a plan view. In addition, one side in the third direction DR3 represents an upward direction (a display direction in the case of a top emission display apparatus) in cross-sectional view (in other words, a front direction in the plan view), and the other side in the third direction DR3 represents a downward direction (a direction opposite to the display direction in the case of a top emission display apparatus) in cross-sectional view (in other words, a backward direction in the plan view). It should be understood, however, that a direction mentioned in the embodiment refers to a relative direction and the embodiments are not limited to the direction mentioned.

Referring to FIGS. 1 to 19, a display apparatus 10 may be a cell-based display apparatus formed by dividing a display apparatus 11 manufactured in a unit of mother substrate into cells, as will be described below (See FIG. 17).

The display apparatus 10 may provide a display screen. Examples of the display apparatus 10 may include an organic light emitting display apparatus, a micro light emitting diode ("LED") display apparatus, a nano LED display apparatus, a quantum dot light emitting display apparatus, a liquid crystal display apparatus, a plasma display apparatus, an electrophoretic display apparatus, an electrowetting display apparatus, and the like. A case where an organic light emitting display apparatus is applied as an example of the display apparatus 10 will be described below, but embodiments are not limited to this case, and the present invention may apply to other display apparatus as long as the same technical spirit is applicable.

The display apparatus 10 may include a flexible display apparatus including a flexible material including a flexible polymer material, such as polyimide, or a flexible substrate. Accordingly, the display apparatus 10 may be bent, curved, folded, or rolled.

Referring to FIGS. 1 to 3, a carrier substrate 21 is prepared in S10.

The planar shape of the carrier substrate 21 (i.e., shape in a plan view) may be a rectangular shape having short sides extending along the first direction DR1 and long sides extending along the second direction DR2. However, embodiments are not limited thereto, such that the planar shape of the carrier substrate 21 may be of other various shapes, such as a rectangular shape having short sides along the second direction DR2 and long sides extending along the first direction DR1, a square, other polygonal shapes, a circular shape, or an elliptical shape.

The carrier substrate 21 may be of a rigid material such as glass or quartz and may provide a space in which a display apparatus is deposited. That is, a plurality of members (i.e., component) of the display apparatus may be sequentially stacked on a top surface 21*t* of the carrier substrate 21.

Figure 4:
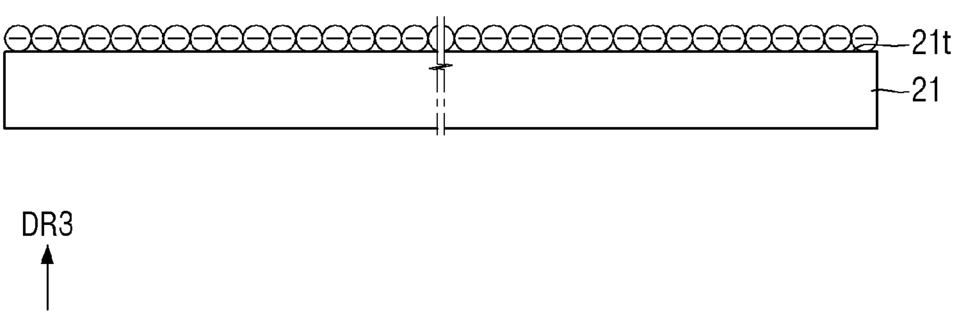
FIGS. 4 to 10, FIGS. 12 to 16, and FIG. 18 are sequential cross-sectional views illustrating a method for manufacturing a display apparatus according to an embodiment.

Referring to FIG. 4, the step S10 of preparing the carrier substrate 21 may further include negatively charging the top surface 21*t* of the carrier substrate 21. The top surface 21*t* of the carrier substrate 21 may be a surface in the upward direction in the cross-sectional view.

The step of negatively charging the top surface 21*t* of the carrier substrate 21 may be performed by surface treatment of the top surface 21*t* of the carrier substrate 21. The surface treatment may be performed by using an atmospheric-pressure plasma device, but is not limited thereto, and may be performed by using a method well known in the art in another embodiment.

After negatively charging the top surface 21*t* of the carrier substrate 21, the whole area of the top surface 21*t* of the carrier substrate 21 may be in a negatively charged state.

Thereafter, referring to FIGS. 5 to 10, a sacrificial layer 30 is formed on the top surface 21*t* of the carrier substrate 21 negatively charged in S20.

Figure 12:
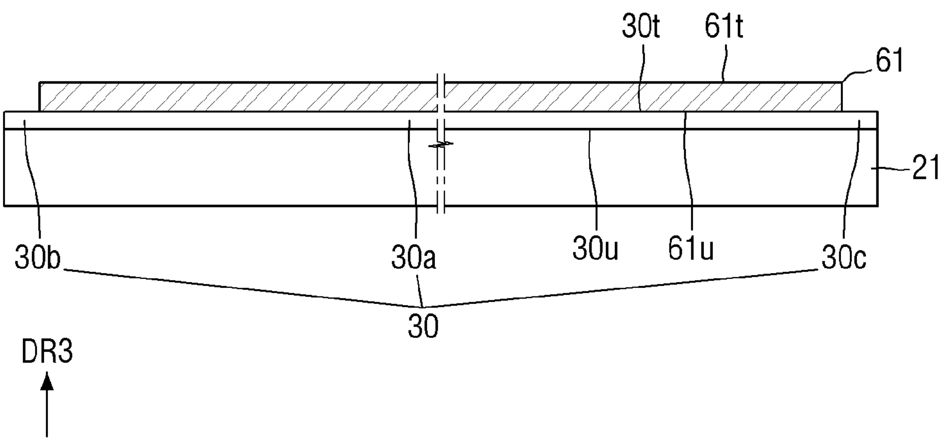

The sacrificial layer 30 may be a de-bonding layer that weakens the adhesion between a first flexible substrate 61 and the carrier substrate 21 so as to facilitate the separation of the carrier substrate 21 from the first flexible material 61 deposited on one surface (e.g., top surface) of the sacrificial layer 30 (See FIG. 12). The de-bonding layer may be made of graphene-oxide (GO). The de-bonding layer may include one coating layer charged with a first electric charge and the other coating layer charged with a second electric charge having a different polarity from a polarity of the first electric charge. The one coating layer and the other coating layer may be directly coated on the top surface 21*t* of the carrier substrate 21 negatively charged. The one coating layer and the other coating layer may be alternately arranged along the third direction DR3.

Hereinafter, the step of forming the sacrificial layer 300 will be described.

Figure 5:
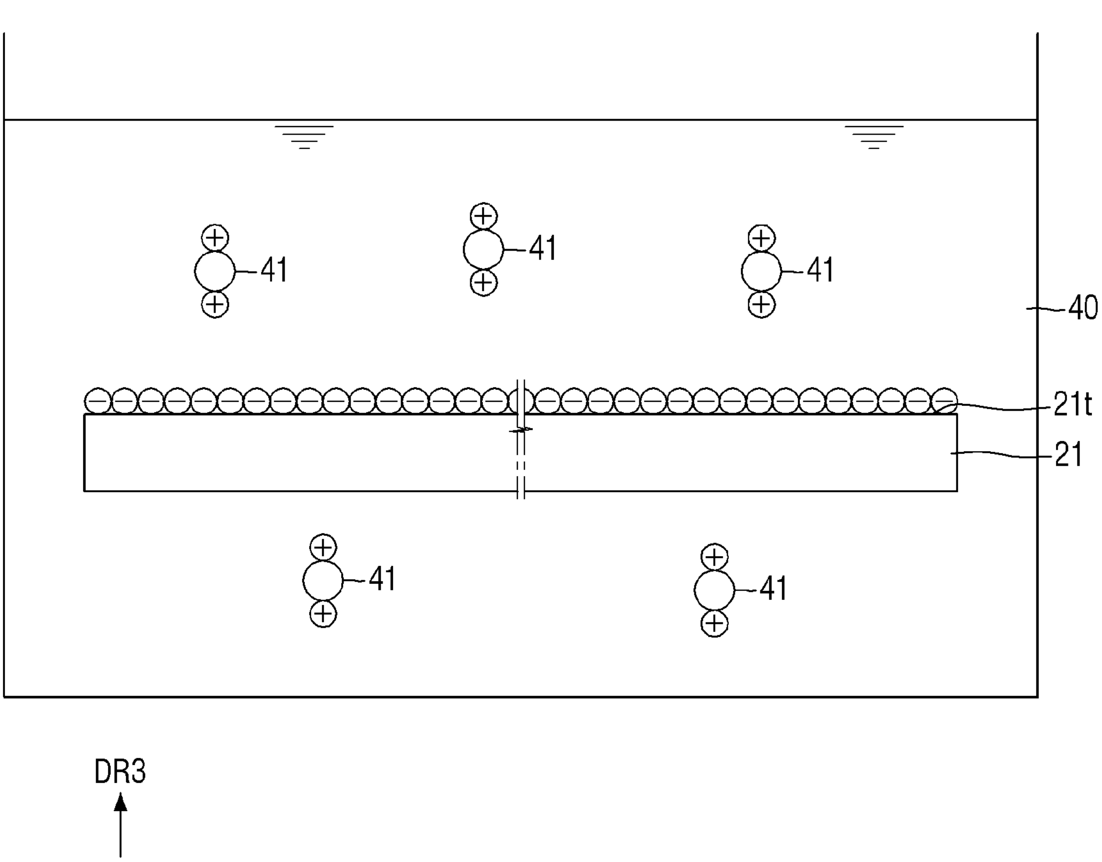

First, the carrier substrate 21 negatively charged is immersed in a first aqueous solution 40 as shown in FIG. 5.

In the first aqueous solution 40, first materials 41 positively charged may be dispersed. The first material 41 may include a positive graphene-oxide.

Figure 6:
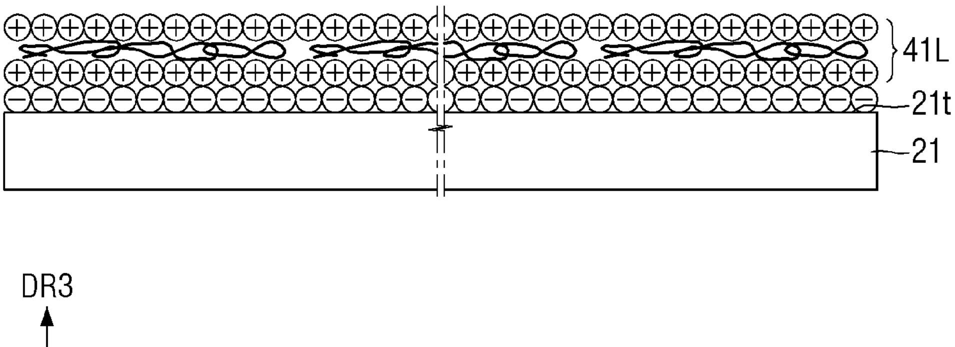

Primary coating of the first material 41 on the top surface 21*t* of the negatively charged carrier substrate 21 may be performed to form a first coating layer 41L as shown in FIG. 6. That is, a positive charge of the first material 41 may be coupled to a negative charge charged on the top surface 21*t* of the carrier substrate 21 through electrostatic attraction therebetween.

The first coating layer 41L may be a layer formed by one layer of the first materials 41 over the entire surface of the carrier substrate 21. The first coating layer 41L may be formed over the entire surface of the carrier substrate 21.

The positive charges positioned on the bottom surface of the layer of the first materials 41 facing the top surface 21*t* of the carrier substrate 21 may be coupled to the negative charges charged on the top surface 21*t* of the carrier substrate 21, and the positive charges positioned on the top surface that is the opposite to the bottom surface of the layer of the first materials 41 may be exposed to the outside. That is, the surface of the first coating layer 41L may be in a positively charged state.

Figure 7:
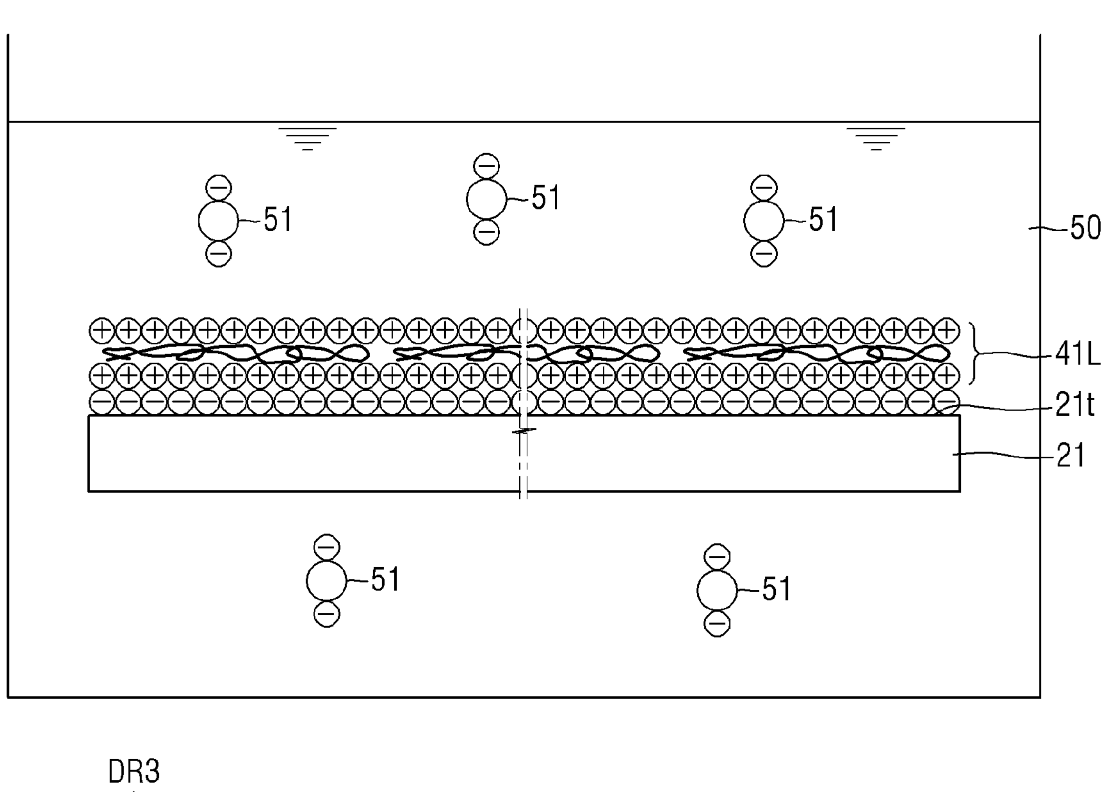

Thereafter, as shown in FIG. 7, the positively charged first coating layer 41L and the carrier substrate 21 are immersed in a second aqueous solution 50.

In the second aqueous solution 50, second materials 51 negatively charged may be dispersed. The second material 51 may include a negative graphene-oxide.

Figure 8:
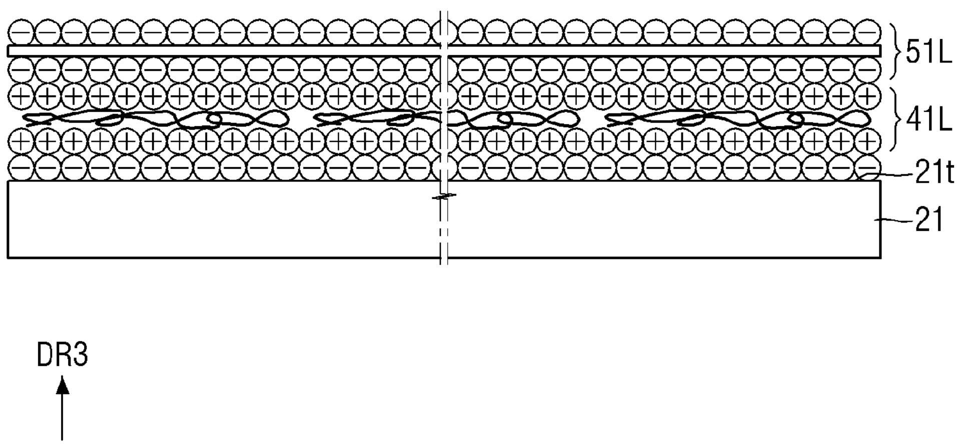

Second coating of the second material 51 on one surface (i.e., top surface) of the positively charged first coating layer 41L may be performed to form a second coating layer 51L as shown in FIG. 8. That is, one negative charge of the second material 51 may be coupled to the positive charge charged on the top surface of the first coating layer 41L through electrostatic attraction therebetween.

The second coating layer 51L may be a layer formed by one layer of the second materials 51 over the entire surface of the first coating layer 41L. The second coating layer 51L may be formed over the entire surface of the carrier substrate 21.

Negative charges positioned on a bottom surface of the second coating layer 51L may be coupled to the positive charges charged on the top surface of the first coating layer 41L, and negative charges positioned on the top surface that is opposite to the bottom surface of the second coating layer 51L may be exposed to the outside.

Figure 9:
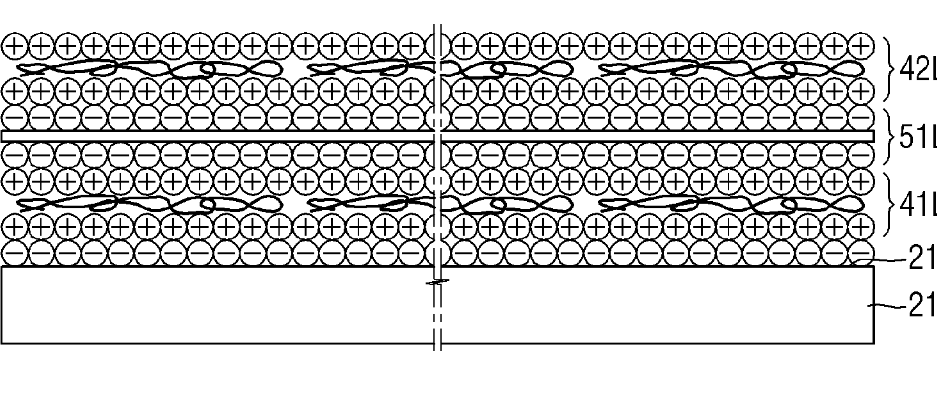

Thereafter, when the negatively charged second coating layer 51L, the first coating layer 41L, and the carrier substrate 21 are immersed in the first aqueous solution 40 again, third coating of the first material 41 on a top surface of the negatively charged second coating layer 51L may be performed to form a third coating layer 42L as shown in FIG. 9. The process of immersing the negatively charged second coating layer 51L, the first coating layer 41L, and the carrier substrate 21 in the first aqueous solution 40 differs from the process of immersing the carrier substrate 21 in the first aqueous solution 40 of FIG. 5 only in the configuration of immersion, and the material of the first aqueous solution 40 is the same in both processes. Therefore, a redundant description of the process will be omitted.

One positive charge of the first material 41 may be coupled to the negative charge charged on the top surface of the second coating layer 51L through electrostatic attraction therebetween.

The third coating layer 42L may be a layer formed by one layer of the first materials 41 over the entire surface of the second coating layer 51L. The third coating layer 42L may be formed over the entire surface of the carrier substrate 21.

Positive charges positioned on a bottom surface of the third coating layer 42L may be coupled to the negative charges charged on the top surface of the second coating layer 51L, and positive charges positioned on the top surface that is opposite to the bottom surface of the third coating layer 42L may be exposed to the outside.

Figure 10:
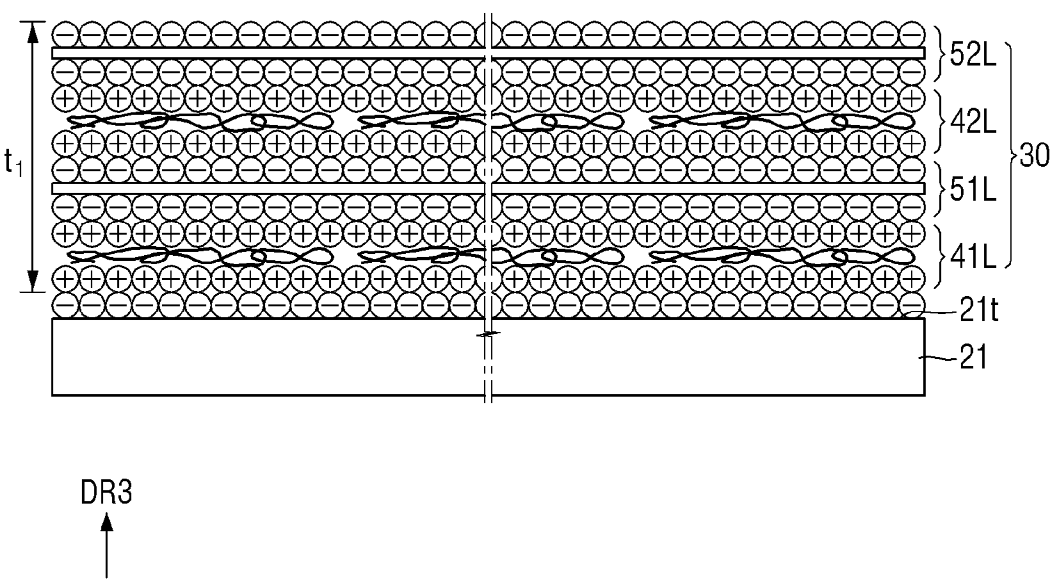

Thereafter, when the positively charged third coating layer 42L, the second coating layer 51L, the first coating layer 41L, and the carrier substrate 21 are immersed in the second aqueous solution 50 again, fourth coating of the second material 51 on the top surface of the positively charged third coating layer 42L may be performed to form a fourth coating layer 52L as shown in FIG. 10. The process of immersing the positively charged third coating layer 42L, the second coating layer 51L, the first coating layer 41L, and the carrier substrate 21 in the second aqueous solution 50 differs from the process of immersing the positively charged first coating layer 41L and the carrier substrate 21 in the second aqueous solution 50 of FIG. 7 only in the configuration of immersion, and the material of the second aqueous solution 50 is the same in both processes. Therefore, a redundant description of the process will be omitted.

One negative charge of the second material 51 may be coupled to the positive charge charged on the top surface of the third coating layer 42L through electrostatic attraction therebetween.

The fourth coating layer 52L may be a layer formed by one layer of the second materials 51 over the entire surface of the third coating layer 42L. The fourth coating layer 52L may be formed over the entire surface of the carrier substrate 21.

Negative charges positioned on a bottom surface of the fourth coating layer 52L may be coupled to the positive charges charged on the top surface of the third coating layer 42L, and negative charges positioned on a top surface that is opposite to the bottom surface of the fourth coating layer 52L may be exposed to the outside.

The sacrificial layer 30 may include the first coating layer 41L, the second coating layer 51L, the third coating layer 42L, and the fourth coating layer 52L that are sequentially stacked on the top surface 21*t* of the carrier substrate 21 in the third direction DR3. Here, one coating layer positively charged and another adjacent coating layer negatively charged may form a bi-layer. That is, the positively charged first coating layer 41L and the negatively charged second coating layer 51L may form a first bi-layer, and the positively charged third coating layer 42L and the negatively charged fourth coating layer 52L may form a second bi-layer. That is, the sacrificial layer 30 may include a dyad bi-layer in which the first bi-layer and the second bi-layer are sequentially stacked.

However, the present disclosure is not limited thereto, such that the sacrificial layer 30 may further include another bi-layer sequentially stacked on the second bi-layer to provide three or more bi-layers, or the sacrificial layer 30 may include one bi-layer.

Hereinafter, a configuration in which there are two bi-layers, that is, the first coating layer 41L, the second coating layer 51L, the third coating layer 42L, and the fourth coating layer 52L are sequentially stacked on the top surface 21*t* of the carrier substrate 21 in the third direction DR3 will be mainly described.

A top surface 30*t* (see FIG. 12) of the sacrificial layer 30 may correspond to the top surface of the fourth coating layer 52L, and a bottom surface 30*u* (see FIG. 12) of the sacrificial layer 30 may correspond to bottom surface of the first coating layer 41L.

As described above, the sequentially stacked first coating layer 41L, second coating layer 51L, third coating layer 42L, and fourth coating layer 52L of the sacrificial layer 30 may be formed over the entire surface of the carrier substrate 21.

When the first flexible material 61, which will be described below, is in direct contact with the carrier substrate 21, the first flexible material 61 may remain on the carrier substrate 21 after the process of separation of the carrier substrate, and it may be difficult to remove the remaining first flexible material 61 or the like from the carrier substrate 21. That is, a polishing process is performed when the first flexible material 61 or the like is removed from the carrier substrate 21, and scratches and sludge may be generated on the surface of the carrier substrate 21 when polishing is in progress. That is, even when the sacrificial layer is formed between the carrier substrate 21 and the first flexible material 61, if the arrangement area of the first flexible material 61 is greater than the arrangement area of the sacrificial layer, the first flexible material 61 comes into direct contact with the top surface 21*t* of the carrier substrate 21, making it difficult to reuse the carrier substrate 21.

According to the method for manufacturing a display apparatus in accordance with an embodiment, the sacrificial layer 30 is formed on the entire surface of the carrier substrate 21 so that it is possible to fundamentally prevent the first flexible material 61 from coming into contact with the top surface 21*t* of the carrier substrate 21.

Further, after the first flexible material 61 and the plurality of members formed thereon are formed, the first flexible material 61 and the plurality of members may be cut in each unit cell. As described above, when the sacrificial layer 30 is formed on the entire surface of the carrier substrate 21, the arrangement area of the first flexible material 61 and the plurality of members can be increased. Accordingly, when the display apparatus is formed from a unit of mother substrate into units of cells, it is possible to prevent waste of materials and to form more cell-based display apparatuses from one unit mother substrate.

In some embodiments, the first coating layer 41L, the second coating layer 51L, the third coating layer 42L, and the fourth coating layer 52L that are sequentially stacked on the sacrificial layer 30 may be formed further inside than side surfaces of the carrier substrate 21, without being formed over the entire surface of the carrier substrate 21.

The sacrificial layer 30 may have a first thickness t1 from the top surface 21*t* of the carrier substrate 21. The first thickness t1 may be, for example, approximately 50 micrometers (μm) to approximately 60 μm, but the thickness according to the invention is not limited thereto.

Figure 11:
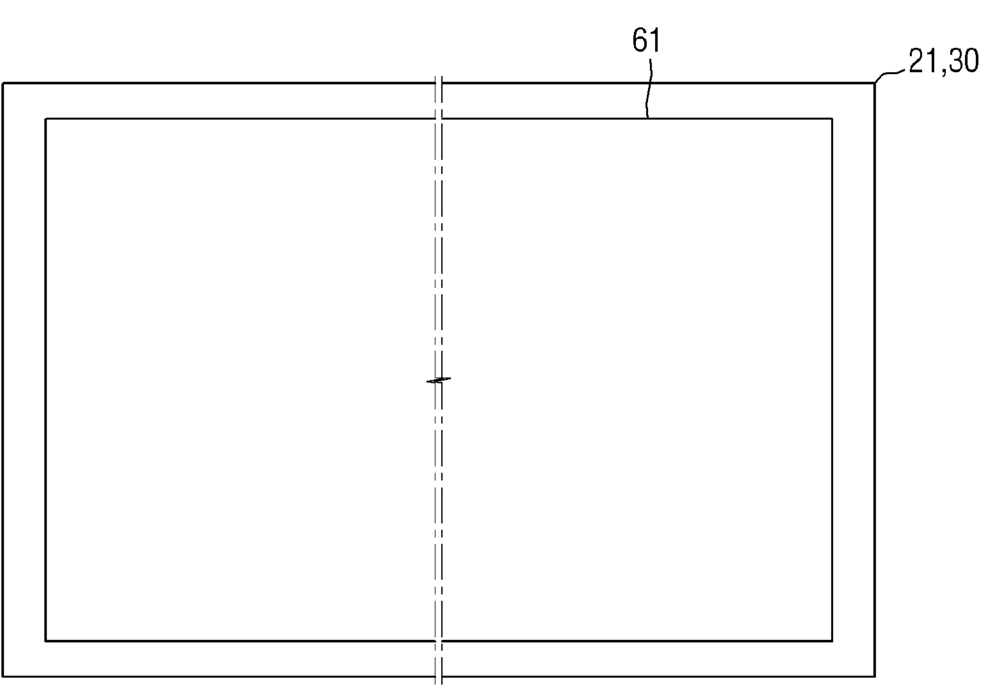
FIGS. 11 and 17 are sequential cross-sectional views illustrating a method for manufacturing a display apparatus according to an embodiment.
Figure 11:
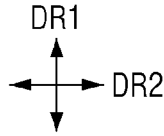

Then, referring to FIGS. 1, 11, and 12, the first flexible material 61 is formed on the top surface 30*t* of the sacrificial layer 30 in S30.

The first flexible material 61 may include a flexible material such as polyimide ("PI") or the like.

The first flexible material 61 may be formed such that the bottom surface 61*u* thereof comes into contact with the top surface 30*t* of the sacrificial layer 30.

The step S30 of forming the first flexible material 61 may include forming the first flexible material 61 on the top surface 30*t* of the sacrificial layer 30 by using a slit coating method. When the first flexible material 61 is formed on the top surface 30*t* of the sacrificial layer 30 by using a slit coating method, an end of the first flexible material 61 from which slit coating starts has a shape protruding toward one side in the third direction DR3 and thus the thickness of the corresponding area is greater than the thickness of the other area. However, the present disclosure is not limited thereto, and the thickness of the first flexible material 61 may be uniform in another embodiment.

The step S30 of forming the first flexible material 61 may include forming the first flexible material 61 further inside one side surface and the other side surface of the sacrificial layer 30. That is, as shown in FIG. 12, the sacrificial layer 30 may include a cover area 30*a* overlapping the first flexible material 61 in the third direction DR3 and exposure areas 30*b* and 30*c* that do not overlap the first flexible material 61 in the third direction DR3.

The cover area 30*a* of the sacrificial layer 30 may be in directly contact with the first flexible material 61 in the third direction DR3 and covered by the first flexible material 61. The top surface 30*t* of the sacrificial layer 30 in the exposure areas 30*b* and 30*c* may not be in contact with the first flexible material 61 and may be exposed by the first flexible material 61.

In the step S30 of forming the first flexible material 61, the first flexible material 61 is formed further inside than one side surface and the other side surface of the sacrificial layer 30 so that the first flexible material 61 is proactively prevented from overflowing to the outside of the carrier substrate 21 and coming into contact with one side surface and the other side surface of the carrier substrate 21.

According to the method for manufacturing a display apparatus in accordance with an embodiment, in the step S30 of forming the first flexible material 61, the first flexible material 61 may be formed not to be in contact with the carrier substrate 21. That is, the sacrificial layer 30 is formed on the entire surface of the carrier substrate 21 and the first flexible material 61 is formed further inside than one side surface and the other side surface of the sacrificial layer 30 as described above, so that the first flexible material 61 may not be in contact with the top surface 21*t* of the carrier substrate 21.

Even in an embodiment in which the first coating layer 41L, the second coating layer 51L, the third coating layer 42L, and the fourth coating layer 52L that are sequentially stacked on the sacrificial layer 30 are not formed over the entire surface of the carrier substrate 21 and are formed further inside than one side surface and the other side surface of the carrier substrate 21, the first flexible material 61 may be formed further inside than one side surface and the other side surface of the sacrificial layer 30.

Figure 13:
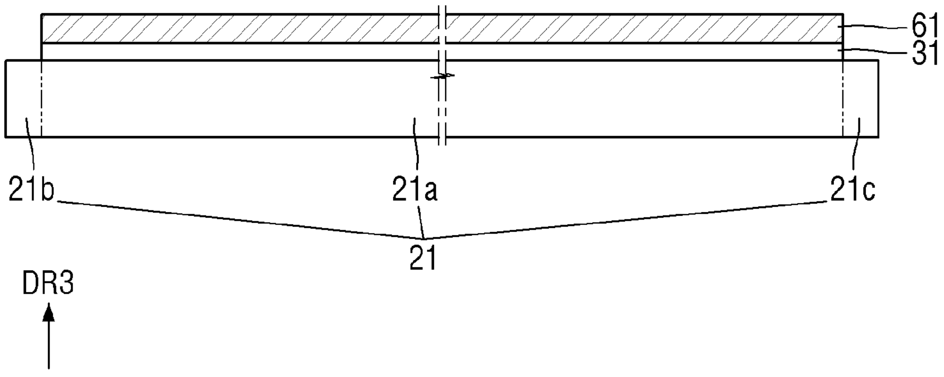
Figure 14:
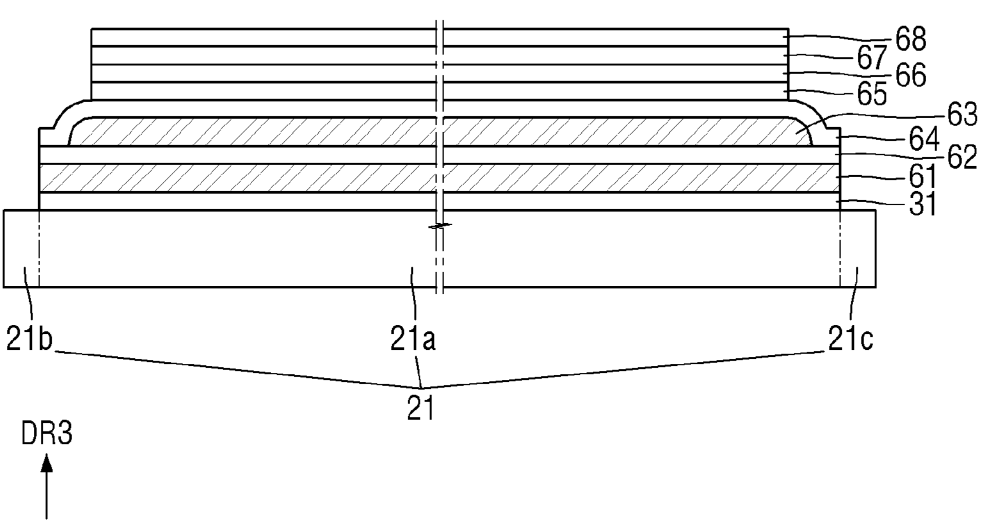

Then, referring to FIGS. 1 and 13, the exposure areas 30*b* and 30*c* of the sacrificial layer 30 are removed to form a sacrificial layer 31 in S40.

More specifically, in one embodiment, the step S40 of removing the exposure areas 30*b* and 30*c* of the sacrificial layer 30 may include removing the exposure areas 30*b* and 30*c* of the sacrificial layer 30 through the surface treatment described above in FIG. 4. The surface treatment may be performed by using an atmospheric-pressure plasma device, but is not limited thereto, and may be performed by using a method well known in the art.

When the surface treatment is performed using an atmospheric-pressure plasma device, a gas in the form of plasma of the atmospheric-pressure plasma device may have a different selectivity for the first flexible material 61 and the sacrificial layer 30. That is, when the gas hits the first flexible material 61 and the sacrificial layer 30, the surface treatment of the first flexible material 61 may not substantially progress, but the surface treatment of the sacrificial layer 30 may progress to a considerable extent. The fact that the surface treatment of the first flexible material 61 does not substantially progress means that the surface of some of the first flexible material 61 may be treated by the gas, but the extent of surface treatment is negligible compared to the sacrificial layer 30.

As shown in FIG. 13, the cover area 30*a* of the sacrificial layer 30 disposed to overlap the first flexible material 61 in the third direction DR3 may not be surface treated and may remain intact as the gas does not reach the cover area 30*a* due to the first flexible material 61, whereas the exposure areas 30*b* and 30*c* of the sacrificial layer 30 disposed not to overlap the first flexible material 61 may be surface treated and removed as the gas reaches the exposure areas 30*b* and 30*c*.

Accordingly, one side surface and the other side surface of the cover area 30*a* of the sacrificial layer 31 may be aligned respectively with one side surface and the other side surface of the first flexible material 61 in the third direction DR3.

The exposure areas 30*b* and 30*c* of the sacrificial layer 30 may be physically and/or chemically damaged in the formation process (e.g., deposition process and etching process) of a first barrier layer 62, a second barrier layer 64, a buffer layer 65, a plurality of inorganic layers of a circuit driving layer 66, and a thin-film encapsulation layer 68. The exposure areas 30*b* and 30*c* that have been physically and/or chemically damaged may be peeled off from the carrier substrate 21, thereby lowering the efficiency of the subsequent process, and cracks may be formed in the sacrificial layer 30 and may be transferred to the plurality of members formed in the subsequent process.

However, in the method for manufacturing a display apparatus according to an embodiment, by removing the exposure areas 30*b* and 30*c* of the sacrificial layer 30, the exposure areas 30*b* and 30*c* of the sacrificial layer 30 may be prevented from being physically and/or chemically damaged in the formation process (e.g., deposition process, etching process, etc.) of the first barrier layer 62, the second barrier layer 64, the buffer layer 65, a plurality of inorganic layers of the circuit driving layer 66, and an inorganic layer of the thin-film encapsulation layer 68. Therefore, it is possible to proactively prevent an occurrence in which the sacrificial layer 30 is peeled off from the carrier substrate 21 due to the physically and/or chemically damaged exposure areas 30*b* and 30*c*, thereby lowering the efficiency of the subsequent process, and cracks are formed in the sacrificial layer 30 and transferred to a plurality of members formed in the subsequent process.

In another example, the step S40 of removing the exposure areas 30*b* and 30*c* of the sacrificial layer 30 may include removing the exposure areas 30*b* and 30*c* of the sacrificial layer 30 through cleansing with water.

When the step S40 of removing the exposure areas 30*b* and 30*c* of the sacrificial layer 30 is performed through washing with water, a washing liquid used may have a different selectivity for the first flexible material 61 and the sacrificial layer 30. That is, when the washing liquid hits the first flexible material 61 and the sacrificial layer 30, the first flexible material 61 may not be substantially washed, but the sacrificial layer 30 may be washed to a considerable extent. The fact that the first flexible material 61 is not substantially washed means that some of the first flexible material 61 may be washed by the washing liquid but the extent of washing is negligible compared to the sacrificial layer 30.

Accordingly, the cover area 30*a* of the sacrificial layer 30 disposed to overlap the first flexible material 61 in the third direction DR is not washed and remains almost intact as the washing liquid hardly reaches the cover area 30*a* due to the first flexible material 61, whereas the exposure areas 30*b* and 30*c* of the sacrificial layer 30 disposed not to overlap the first flexible material 61 may be washed and removed as the washing liquid reaches the exposure areas 30*b* and 30*c*.

A cleaner used in washing with water may remove the exposure areas 30*b* and 30*c* of the sacrificial layer 30 through a chemical reaction. The cleaner may be a basic cleaner including tetramethylammonium hydroxide.

Then, the first barrier layer 62 is formed on the first flexible material 61 in S50.

The first barrier layer 62 may include an inorganic material, such as a silicon nitride layer, a silicon-oxy-nitride layer, a silicon oxide layer, a titanium oxide layer, or an aluminum oxide layer.

The first barrier layer 62 may be formed through deposition and etching process of the inorganic material, or the like.

One side surface and the other side surface of the first barrier layer 62 may be aligned respectively with one side surface and the other side surface of the first flexible material 61 in the third direction DR3. However, the present disclosure is not limited thereto, such that one side surface and the other side surface of the first barrier layer 62 may protrude outward or be recessed inward respectively from one side surface and the other side surface of the first flexible material 61.

Then, the second flexible material 63, the second barrier layer 64, the buffer layer 65, the circuit driving layer 66, a light emitting layer 67, and the thin-film encapsulation layer 68 are sequentially stacked.

The second flexible material 63 may be made of the same material as that constituting the first flexible material 61. One side surface and the other side surface of the second flexible material 63 may be formed to be recessed inward respectively from one side surface and the other side surface of the first flexible material 61. Thus, the second flexible material 63 may be proactively prevented from overflowing outward from side surfaces of the first barrier layer 62 and the first flexible material 61.

The second flexible material 63 may be formed through the slit coating substantially the same as the method of forming the first flexible material 61, so that the second flexible material 63 may have a shape in which one end from which the slit coating starts protrudes in the third direction DR3. A redundant description thereof will be omitted.

The second barrier layer 64 may be formed on the second flexible material 63. The second barrier layer 64 may extend outward from one side surface and the other side surface of the second flexible material 63 to cover and protect the one side surface and the other side surface of the second flexible material 63.

One side surface and the other side surface of the second barrier layer 64 may be aligned respectively with one side surface and the other side surface of the first barrier layer 62 in the third direction DR3.

The buffer layer 65 may be formed on the second barrier layer 64.

The buffer layer 65 may include an inorganic material, such as a silicon nitride layer, a silicon-oxy-nitride layer, a silicon oxide layer, a titanium oxide layer, or an aluminum oxide layer.

The buffer layer 65 may be formed through deposition and etching process of the inorganic material, or the like.

The circuit driving layer 66 may be formed on the buffer layer 65. The circuit driving layer 66 may include a circuit for driving the light emitting layer of a pixel. The circuit driving layer 66 may include a plurality of thin-film transistors.

The light emitting layer 67 may be disposed above the circuit driving layer 66. The light emitting layer 67 may include an organic light emitting layer. The light emitting layer 67 may emit light at various luminance levels according to a driving signal transmitted from the circuit driving layer 66.

The thin-film encapsulation layer 68 may be disposed above the light emitting layer 67. The thin-film encapsulation layer 68 may include an inorganic layer or a stacked layer of an inorganic layer and an organic layer. As another example, the thin-film encapsulation layer 68 may be glass or an encapsulation film.

One side surface and the other side surface of each of the buffer layer 65, the circuit driving layer 66, the light emitting layer 67, and the thin-film encapsulation layer 68 may be formed further inside than one side surface and the other side surface of the second barrier layer 64, respectively, and at least one side surface of each of the buffer layer 65, the circuit driving layer 66, the light emitting layer 67, and the thin-film encapsulation layer 68 may be aligned in the third direction DR3, but the present disclosure is not limited thereto.

Figure 15:
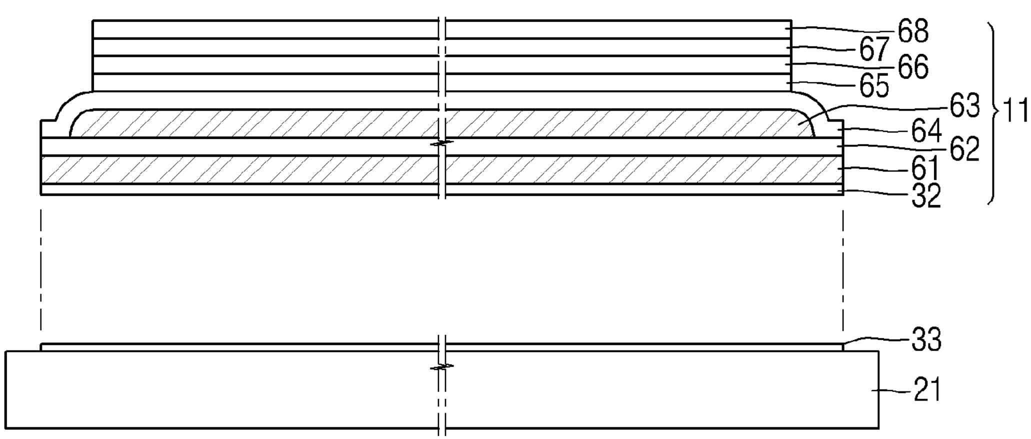
Figure 15:
Figure 16:
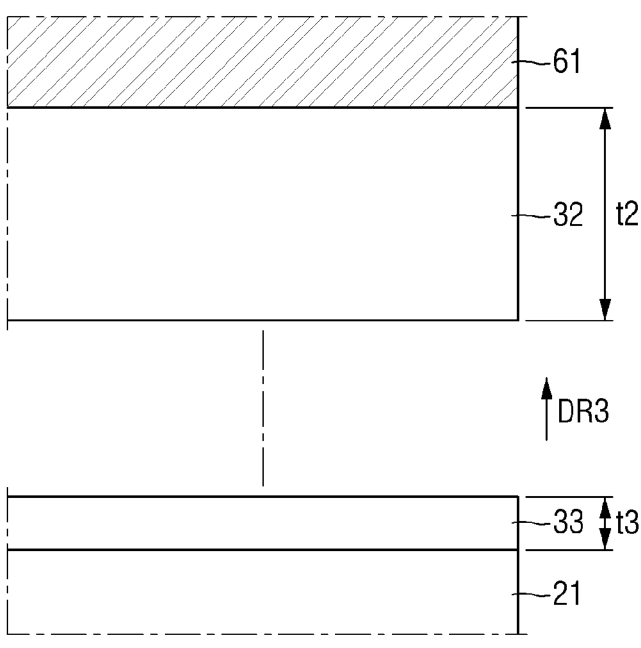

Then, referring to FIGS. 1, 15, and 16, the carrier substrate 21 is removed from the first flexible material 61 in S60.

More specifically, the step S60 of removing the carrier substrate 21 from the first flexible material 61 may be performed through mechanical detachment.

The mechanical detachment may be performed using a glass remove machine ("GRM") which includes a vacuum pad. That is, the GRM is disposed on the bottom surface of the carrier substrate 21 and sucks the bottom surface of the carrier substrate 21 by using the vacuum pad so that the carrier substrate 21 is pulled to the other side in the third direction and the carrier substrate 21 and the first flexible material 61 are physically separated.

As described above, the sacrificial layer 31 may be disposed between the carrier substrate 21 and the first flexible material 61 to weaken the bonding force between the carrier substrate 21 and the first flexible material 61. For example, by disposing the sacrificial layer 31, the bonding force between the first flexible material 61 and the carrier substrate 21 may be lowered to a level of approximately 3 gf/in or less.

In the step S60 of removing the carrier substrate 21 from the first flexible material 61, the sacrificial layer 31 disposed therebetween may remain on each of the bottom surface 61*u* of the first flexible material 61 and the top surface 21*t* of the carrier substrate 21.

A part of the sacrificial layer 32 remaining on the bottom surface 61*u* of the first flexible material 61 may have a second thickness t2, and a part of the sacrificial layer 33 remaining on the top surface 21*t* of the carrier substrate 21 may have a third thickness t3 that is smaller than the second thickness t2.

The sum of the second thickness t2 and the third thickness t3 may be equal to the first thickness t1 in the third direction DR3. The second thickness t2 may be, for example, approximately 4 times greater than the third thickness t3. For example, the second thickness t2 may be approximately 40 μm and the third thickness t3 may be approximately 10 μm.

However, the present disclosure is not limited thereto, and the parts of the sacrificial layers 32 and 33 remaining respectively on the bottom surface 61*u* of the first flexible material 61 and the top surface 21*t* of the carrier substrate 21 may be somewhat further removed in the step S60 of removing the carrier substrate 21 from the first flexible material 61. Thus, the sum of the second thickness t2 and the third thickness t3 may be smaller than the first thickness t1.

Figure 17:
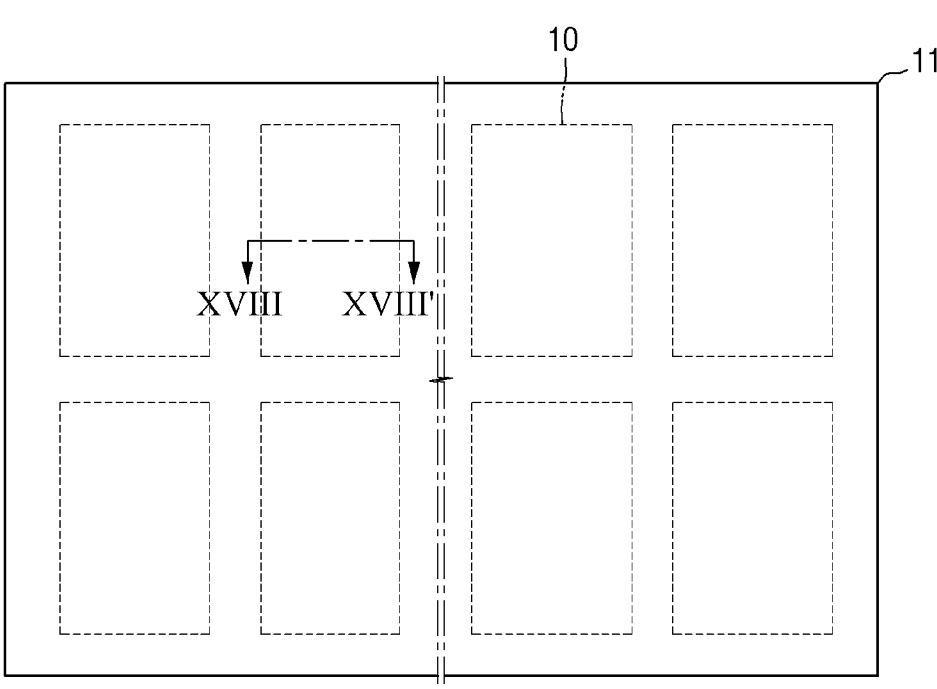
Figure 17:
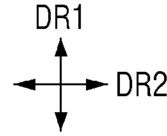

As shown in FIGS. 15, 17, and 18, the parts of the sacrificial layer 32, the first flexible material 61, and a plurality of members disposed thereon constitute the mother substrate-based display apparatus 11.

In some embodiments, a touch layer may be further disposed directly on the thin-film encapsulation layer 68.

The mother substrate-based display apparatus 11 may include a plurality of cell-based display apparatuses 10. Each display apparatus 10 may be formed by cutting the display apparatus 11 in a unit of mother substrate after the carrier substrate 21 is removed from the first flexible material 61 and a release film is disposed on the thin-film encapsulation layer 68 (the release film is disposed on a touch film if the touch film is included).

Although FIG. 17 illustrates that the mother substrate-based display apparatus 11 includes a total of 8 cell-based display apparatuses 10 arranged in two rows, where each row extends in the second direction DR2, and in four columns, where each column extends in the first direction DR1. The number and arrangement of cell-based display apparatuses 10 included in one mother substrate-based display apparatus 11 according to the invention are not limited thereto.

As shown in FIG. 18, in the cell-based display apparatus 10 cut into a cell, the respective one side surfaces and the respective other side surfaces of a sacrificial layer 33', a first flexible material 61', a first barrier layer 62', a second flexible material 63', a second barrier layer 64', a buffer layer 65', a circuit driving layer 66', a light emitting layer 67', and a thin-film encapsulation layer 68' may be aligned in the third direction DR3. The sacrificial layer 33', the first flexible material 61', the first barrier layer 62', the second flexible material 63', the second barrier layer 64', the buffer layer 65', the circuit driving layer 66', the light emitting layer 67', and the thin-film encapsulation layer 68' of the display apparatus 10 of FIG. 18 differ in size, in a plan view, from the sacrificial layer 33, the first flexible material 61, the first barrier layer 62, the second flexible material 63, the second barrier layer 64, the buffer layer 65, the circuit driving layer 66, the light emitting layer 67, and the thin-film encapsulation layer 68 of FIGS. 14 and 15, respectively, but perform the same functions. Thus, detailed descriptions thereof will be omitted.

Referring to FIGS. 1, 15, and 19, after the step S60 of removing the carrier substrate 21 from the first flexible material 61, the sacrificial layer 33 remaining on the top surface 21*t* of the carrier substrate 21 is removed in S70.

The step S70 of removing the sacrificial layer 33 remaining on the top surface 21*t* of the carrier substrate 21 may be performed before the step of manufacturing each cell-based display apparatus 10 from the mother substrate-based display apparatus 11, or may be performed after or concurrently with the manufacturing step.

The step S70 of removing the sacrificial layer 33 remaining on the top surface 21*t* of the carrier substrate 21 may be performed through the surface treatment or washing with water described above in FIG. 13.

More specifically, when the surface treatment is used, the step S70 of removing the sacrificial layer 33 remaining on the top surface 21*t* of the carrier substrate 21 may be performed using the atmospheric-pressure plasma device shown in FIG. 19. The atmospheric-pressure plasma device 70 may include a main body part 71 and a plurality of nozzles 72 connected to the main body part 71. The plasma gas described above in FIG. 13 may be ejected through the nozzles 72.

When the atmospheric-pressure plasma device 70 moves along the second direction DR2, the plasma gas ejected from the nozzles 72 connected to the main body part 71 may hit the sacrificial layer 33, thereby removing the sacrificial layer 33.

Although FIG. 19 illustrates that the atmospheric-pressure plasma device 70 moves along the second direction DR2, the moving direction of the atmospheric-pressure plasma device 70 may be variously modified.

The surface treatment and the washing with water are described in detail with reference to FIG. 13, and the redundant description thereof will be omitted.

Then, after the step S70 of removing the sacrificial layer 33 remaining on the top surface 21*t* of the carrier substrate 21, the carrier substrate 21 may be reused. That is, the processes of FIGS. 5 to 19 may be re-performed on the carrier substrate 21.

As described above, when the first flexible material 61 is in direct contact with the carrier substrate 21, the first flexible material 61 or the like may remain on the carrier substrate 21 after the separation process of the carrier substrate, and it may be difficult to remove the remaining first flexible material 61 or the like from the carrier substrate 21. That is, a polishing process is performed when the first flexible material 61 or the like is removed from the carrier substrate 21, and scratches and sludge may be generated on the surface of the carrier substrate 21 when polishing is in progress. That is, even when the sacrificial layer is formed between the carrier substrate 21 and the first flexible material 61, if the arrangement area of the first flexible material 61 is greater than the arrangement area of the sacrificial layer, the first flexible material 61 comes into direct contact with the top surface 21*t* of the carrier substrate 21, making it difficult to reuse the carrier substrate 21.

However, according to the method for manufacturing a display apparatus in accordance with an embodiment, the sacrificial layer 30 is formed on the entire surface of the carrier substrate 21 so that it is possible to fundamentally prevent the first flexible material 61 from coming into contact with the top surface 21*t* of the carrier substrate 21. Also, after the carrier substrate 21 is separated, the sacrificial layer 33 remaining on the top surface 21*t* of the carrier substrate 21 is easily removed, thereby making it possible to reuse the carrier substrate 21.

Hereinafter, another embodiment is described. In the following embodiment, the same components as those of the above-described embodiment are denoted by the same reference numerals, and a description thereof will be omitted or simplified for descriptive convenience.

Figure 20:
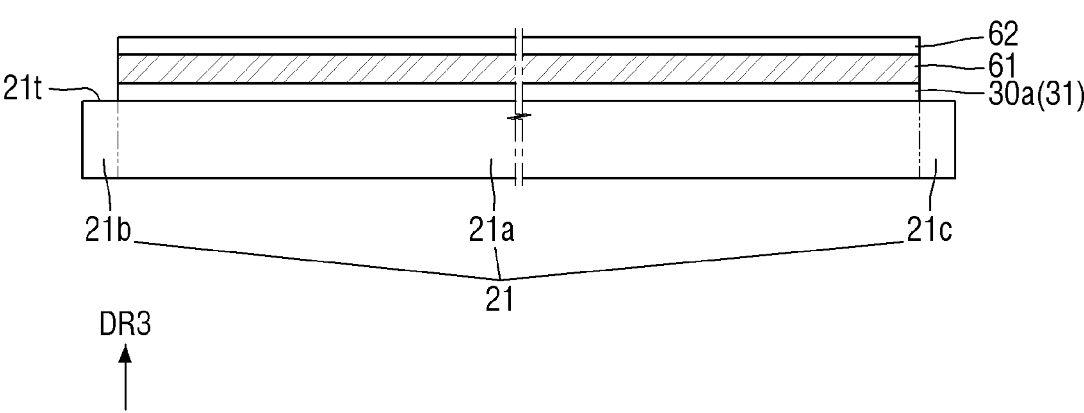
FIG. 20 is a cross-sectional view illustrating a process of a method for manufacturing a display apparatus according to another embodiment.

FIG. 20 is a cross-sectional view illustrating a process of a method for manufacturing a display apparatus according to another embodiment.

Referring to FIG. 20, a method for manufacturing a display apparatus differs from the method for manufacturing a display apparatus according to the embodiment in that a step of forming a first barrier layer 62 is performed between the step S30 of forming the first flexible material 61 on the top surface 30*t* of the sacrificial layer 30 in accordance with FIG. 12 and the step S40 of forming the sacrificial layer 31 by removing the exposure areas 30*b* and 30*c* of the sacrificial layer 30 in accordance with FIG. 13.

More specifically, the selectivity of the first barrier layer 62 and the selectivity of sacrificial layer 30 for the plasma gas described above in FIG. 13 may be different. That is, like the first flexible material 61, the first barrier layer 62 may hardly react to the plasma gas.

One side surface and the other side surface of the first barrier layer 62 may be aligned respectively with one side surface and the other side surface of the first flexible material 61 in the third direction DR3. In this case, the removed area of the sacrificial layer 30 may be the same as that in the step S40 of forming the sacrificial layer 31 by removing the exposure areas 30*b* and 30*c* of the sacrificial layer 30. This also applies to the case where one side surface and the other side surface of the first barrier layer 62 are formed further inside than one side surface and the other side surface of the first flexible material 61.

However, when one side surface and the other side surface of the first barrier layer 62 protrude outward from one side surface and the other side surface of the first flexible material 61, the removed area of the sacrificial layer 30 may be smaller than that in the step S40 of forming the sacrificial layer 31 by removing the exposure areas 30*b* and 30*c* of the sacrificial layer 30, due to the protruding first barrier layer 62.

In the case of applying the washing with water described above in FIG. 13, when one side surface and the other side surface of the first barrier layer 62 protrude outward from one side surface and the other side surface of the first flexible material 61, the removed area of the sacrificial layer 30 may be smaller than that in the step S40 of forming the sacrificial layer 31 by removing the exposure areas 30*b* and 30*c* of the sacrificial layer 30, due to the protruding first barrier layer 62. However, when washing is performed as a washing liquid flows under the protruding portion of the first barrier layer 62 and hits the top surface 30*t* of the sacrificial layer 30, the removed area of the sacrificial layer 30 may be substantially the same as that in the step S40 of forming the sacrificial layer 31 by removing the exposure areas 30*b* and 30*c* of the sacrificial layer 30.

According to a display apparatus and a method for manufacturing the display apparatus in accordance with one embodiment, a carrier substrate may be reused after a flexible display apparatus is deposited on the carrier substrate.

The effects of the embodiments of the present disclosure are not restricted to the one set forth herein. The above and other effects of the embodiments will become more apparent to one of daily skill in the art to which the embodiments pertain by referencing the claims.

While the subject matter of the present disclosure has been particularly illustrated and described with reference to exemplary embodiments thereof, it will be understood by those of ordinary skill in the art that various changes in form and detail may be made therein without departing from the spirit and scope of the present disclosure as defined by the following claims, and equivalents thereof. The exemplary embodiments should be considered in a descriptive sense only and not for purposes of limitation.

REFERENCE NUMERALS

10, 11: DISPLAY APPARATUS
20: CARRIER SUBSTRATE
30: SACRIFICIAL LAYER
61: FIRST FLEXIBLE MATERIAL
62: FIRST BARRIER LAYER

The invention claimed is:

1. A method for manufacturing a display apparatus comprising:

preparing a carrier substrate and forming a sacrificial layer on a top surface of the carrier substrate, the sacrificial layer including a cover area and an exposure area located on at least one side of the cover area;

forming a first flexible material having a bottom surface in contact with the sacrificial layer on a top surface of the cover area of the sacrificial layer to expose the exposure area of the sacrificial layer;

removing the exposure area of the sacrificial layer, and removing the carrier substrate from the first flexible material after removing the exposure area of the sacrificial layer, wherein the forming of the sacrificial layer comprises alternately forming a first coating layer charged with a first electric charge and a second coating layer charged with a second electric charge having a different polarity from a polarity of the first electric charge.

2. The method of claim 1, wherein the preparing of the carrier substrate further comprises negatively charging the top surface of the carrier substrate.

3. The method of claim 2, wherein the negatively charging of the top surface of the carrier substrate is performed using an atmospheric-pressure plasma device.

4. The method of claim 1, wherein the first electric charge is a positive charge and the second electric charge is a negative charge.

5. The method of claim 1, wherein each of the first coating layer and the second coating layer includes graphene oxide (GO).

6. The method of claim 1, wherein the removing of the exposure area of the sacrificial layer is performed using an atmospheric-pressure plasma device or through washing with water.

7. The method of claim 1, wherein after removing the exposure area of the sacrificial layer, side surfaces of the sacrificial layer and the flexible material are aligned.

8. The method of claim 7, further comprising:

forming a first barrier layer on the first flexible material after removing the exposure area of the sacrificial layer.

9. The method of claim 8, further comprising: sequentially forming a second flexible material on the first barrier layer, a circuit driving layer on the second flexible material, a light emitting layer on the circuit driving layer, and an encapsulation layer on the light emitting layer.

10. The method of claim 1, wherein in the removing of the carrier substrate from the first flexible material, the sacrificial layer remains on the top surface of the carrier substrate and on a bottom surface of the first flexible material.

11. The method of claim 10, wherein a thickness of the sacrificial layer remaining on the top surface of the carrier substrate is smaller than a thickness of the sacrificial layer remaining on the bottom surface of the first flexible material.

12. The method of claim 10, further comprising:

removing the sacrificial layer remaining on the top surface of the carrier substrate after removing the carrier substrate from the first flexible material.

13. The method of claim 12, wherein the removing of the sacrificial layer remaining on the top surface of the carrier substrate is performed using an atmospheric-pressure plasma device or through washing with water.

14. A display apparatus comprising:

a first flexible substrate;

a first barrier layer disposed on a top surface of the first flexible substrate;

a second flexible substrate disposed on the first barrier layer;

a circuit driving layer disposed on the second flexible substrate; and a residue disposed on a bottom surface that is opposite to the top surface of the first flexible substrate, wherein one side surface of the residue is aligned with one side surface of the first flexible substrate and wherein the second flexible substrate is made of a same material as that constituting the first flexible substrate.

* * * * *